Figure 1:
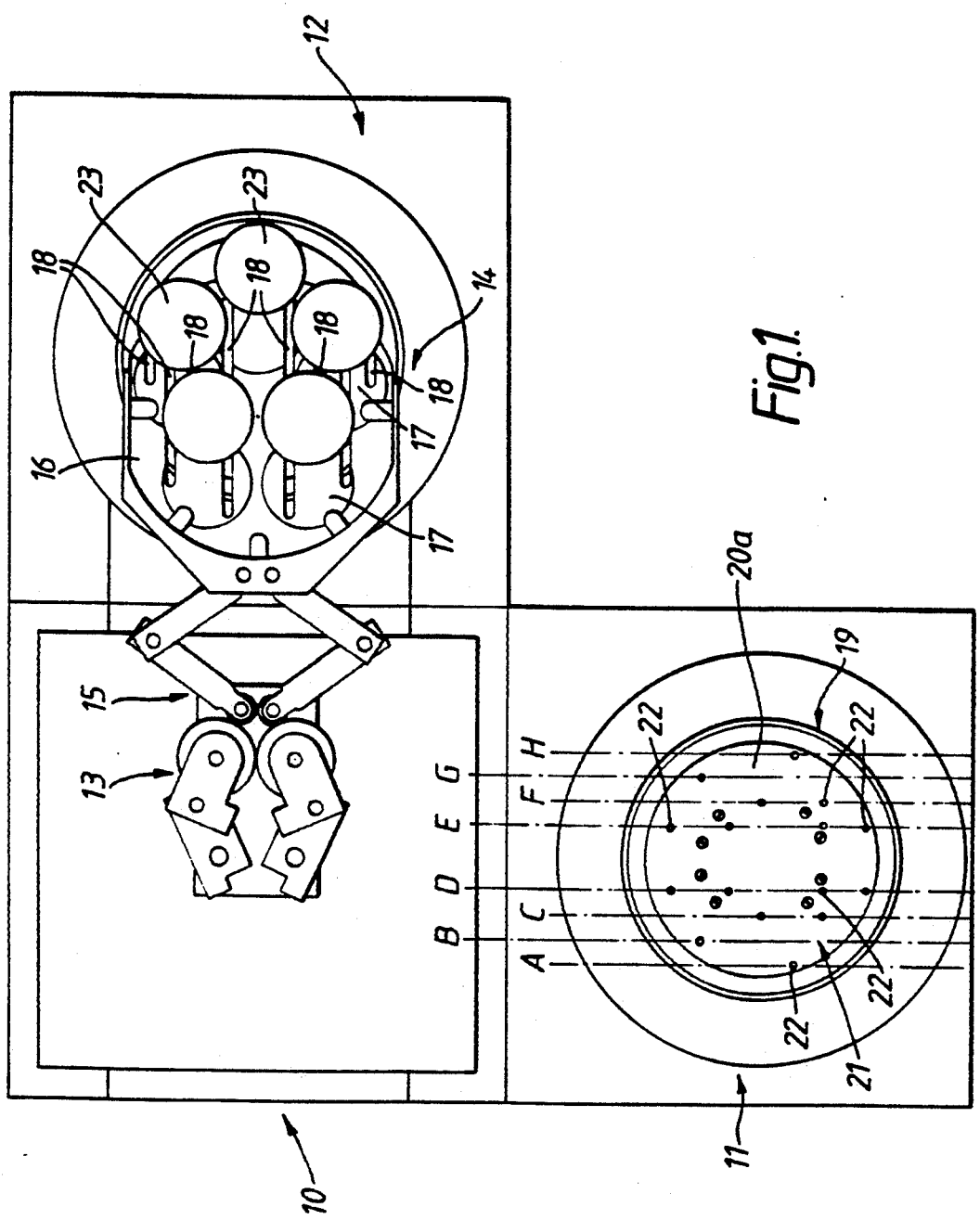

United States Patent [19]

Brancher

[11] Patent Number: 5,330,301
[45] Date of Patent: Jul. 19, 1994

[54] LOADING MECHANISMS

[75] Inventor: Carl D. Brancher, Abergavenny, United Kingdom

[73] Assignee: Surface Technology Systems Limited, Newport, United Kingdom

[21] Appl. No.: 924,022

[22] PCT Filed: Feb. 14, 1991

[86] PCT No.: PCT/GB91/00221
§ 371 Date: Sep. 1, 1992
§ 102(e) Date: Sep. 1, 1992

[87] PCT Pub. No.: WO91/15032
PCT Pub. Date: Oct. 3, 1991

[30] Foreign Application Priority Data

Mar. 22, 1990 [GB] United Kingdom ............ 9006471.8

[51] Int. Cl.⁵ ............................................. B65G 65/00
[52] U.S. Cl. ................................. 414/417; 414/608; 414/222; 414/403; 414/937; 414/940; 414/749; 118/500; 198/346.1; 198/339.1; 198/346.3
[58] Field of Search .............. 414/403, 404, 217, 749, 414/416, 417, 940, 935, 937, 938, 222, 608, 799; 118/500, 718; 198/339.1, 345.3, 346.1, 346.3

[56] References Cited

U.S. PATENT DOCUMENTS

| | | | |
|---|---|---|---|
| 2,274,464 | 2/1942 | Thomas | 414/417 X |
| 2,451,226 | 10/1948 | Kemp, Jr. | 414/608 X |
| 2,856,089 | 10/1958 | Lennon | 414/417 |
| 3,151,754 | 10/1964 | Kemp, Jr. | 414/417 |
| 3,926,323 | 12/1975 | Frank et al. | 414/417 |
| 4,534,695 | 8/1985 | Stump et al. | |
| 4,571,141 | 2/1986 | Gieson | 414/417 |
| 4,856,641 | 8/1989 | Matsumura et al. | |
| 5,104,278 | 4/1992 | Mayne | 414/417 |

FOREIGN PATENT DOCUMENTS

| | | |
|---|---|---|
| 0063289 | 10/1982 | European Pat. Off. . |
| 0211292 | 2/1987 | European Pat. Off. . |
| 3909669 | 10/1989 | Fed. Rep. of Germany . |
| 2156582 | 10/1985 | United Kingdom . |
| 2198881 | 6/1988 | United Kingdom . |

Primary Examiner—Frank E. Werner
Attorney, Agent, or Firm—Young & Thompson

[57] ABSTRACT

A processing apparatus 10 has chambers 11 and 12 and a loading mechanism 13 for transferring workpieces into and out of the chambers. The workpieces are carried on a pallet 16 which is slotted so that, when it is inserted into the chambers 11 or 12 the slots are aligned with lines A-H on lifting pins. This arrangement enables the mechanism 13 to withdraw the pallet, whilst the pins 22 are in their erect position.

4 Claims, 2 Drawing Sheets

LOADING MECHANISMS

This invention relates to batch loading mechanisms and in particular, but not exclusively, to loading mechanisms for use with semi-conductor processing apparatus.

Currently semi-conductor wafers are processed either as single wafers or in batches. Batches can be loaded one at a time, or as a batch on a pallet. Loading a batch one at a time is time consuming and subjects the individual wafers in the batch to varying conditions. Those loaded earliest will have spent longer in the chamber than those loaded last. This will adversely affect the process uniformity across the batch. In extreme cases the first loaded wafers will be spoilt by the wait for the last to load, or the last to load will not be processed properly because they have not achieved the same state as those that have been loaded earlier. This is particularly the case where the process involves heating. In many processes the heat required to achieve a good process is sufficiently high as to cause undesirable side effects and damage if continued for too long. It is therefore important to achieve such a temperature but to minimise the length of time the wafers are at such temperatures. If the batch loading time is significant then either the first to load will have been subjected to excessive time-at-temperature or the last to load have had insufficient time to reach the correct temperature.

The present invention consists in a workpiece loading mechanism, comprising a work station having a plurality of lifting elements arranged in lines and means for moving the elements between the workpiece lift position and a rest position; a pallet for supporting workpieces and means for moving the pallet into and out of the work station, the pallet having a plurality of slots corresponding to the lines of the elements such that the elements can pass through the slots when the pallet is at the work station, to lift the workpieces off the pallet and such that the pallet can be withdrawn from the work station with the elements in the workpiece lift position.

Preferably the lines are substantially straight and substantially parallel. In some instances single elements may consitute a line for these purposes but at least some of the lines will include a plurality of elements. The elements may be in the form of pins. Conveniently the elements are mounted on a common base for simultaneous movement for example by means of a hydraulic ram.

The invention also consists in a gas reactor having a work station including a vacuum chamber and a mechanism as defined above for loading workpieces through a side wall thereon.

The workpieces may be semi-conductor wafers.

Although the invention has been defined above it is to be understood that it includes any inventive combination of the features set out above or in the following description.

Figure 2:
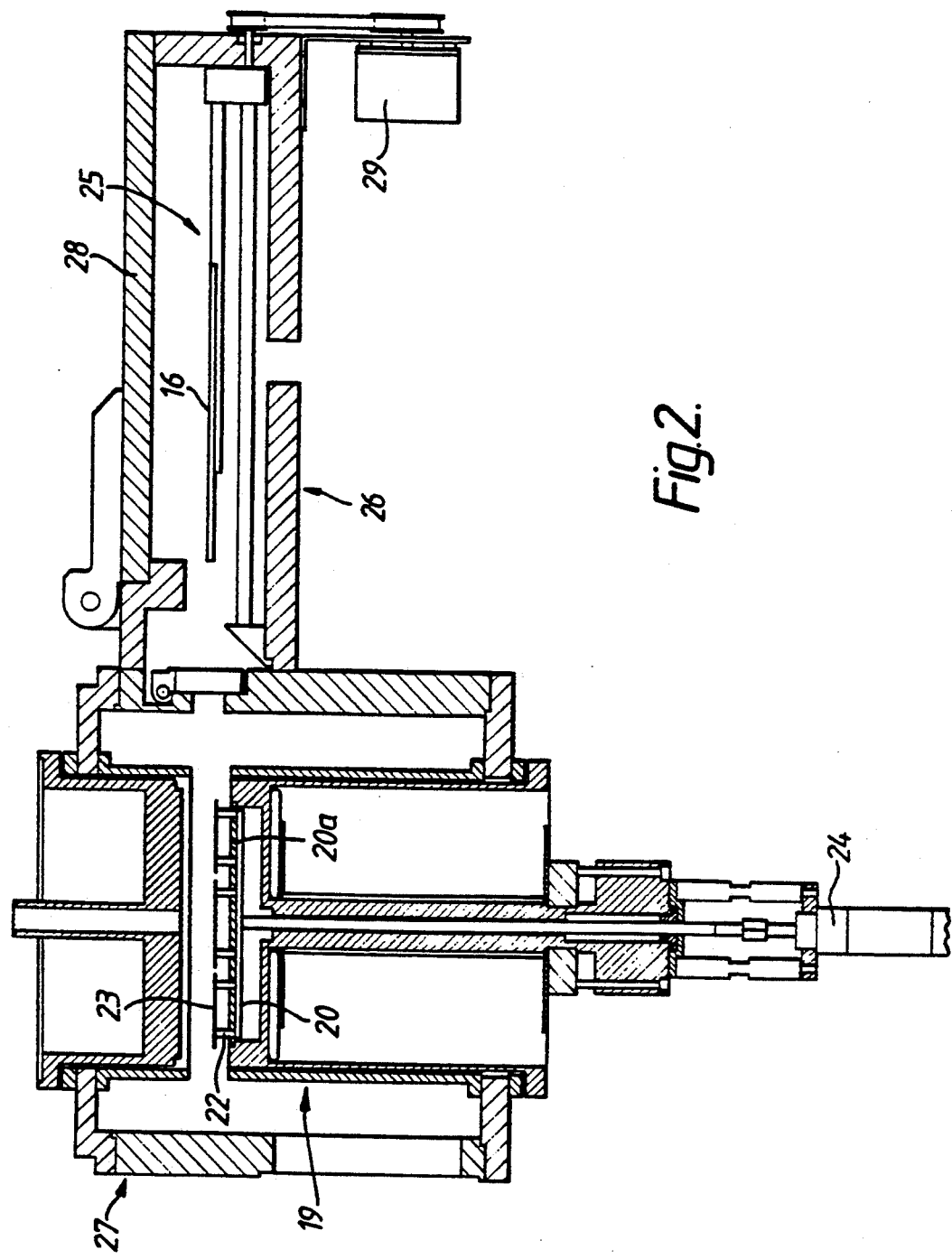

The invention may be performed in various ways and specific embodiments will now be described, by way of example, with reference to the accompanying drawings, in which:

FIG. 1 is a plan view of a dual chamber processing apparatus with one form of loading mechanism, and FIG. 2 is a cross-sectional view of a single chamber apparatus with a different form of loading mechanism.

Referring first to FIG. 1 a processing apparatus 10 has chambers 11 and 12 and a loading mechanism generally indicated at 13. The loading mechanism 13 includes a carrier 14 and an actuating mechanism 15 which can move the carrier 14 in a straight line into or out of the chambers 11 and 12 using a "frog legs" mechanism. One example is manufactured by Brooks Automation.

As will be seen a pallet 16 can be placed into the carrier 14. The pallet 16 which has a number of recessed semi-conductor wafer locations 17 and eight slots 18 of different lengths, extending into, and in some cases through, the locations 17 from the leading edge of the pallet 16.

As can best be seen in FIG. 2 a work station 19, in chamber 12, has a base 20 on which is positioned an array 21 of pins 22 which are, when viewed in one direction, aligned in a series of parallel lines which are indicated at A-H. A similar array exists in chamber 11 except the lines A-H are orthogonal to those in chamber 12.

In operation the wafers are loaded on the pallet 16 and the pallet 16 is placed on the carrier 14 when it is outside a chamber. The loaded carrier is then fed into the chamber 11 or 12. The base 20 is then lifted so that the pins 22 move up through their respective slots 18 to lift the wafers 23 from the pallet 16 and to support them in that lifted position. Because the slots 18 are aligned with the lines A-H the pallet 16 can then be withdrawn from the chamber and the pins can then be lowered placing the wafers 23 onto a workpiece support table 20a. In some circumstances it may not be necessary to lower the pins.

Unloading is exactly the reverse procedure and again the slots 18 allow the pallet 16 to pass the pins 22.

As can be seen in FIG. 2 the base 20 may be mounted on a hydraulic ram 24 to provide the lift for the pins. Other suitable mechanisms may be used and the pins may be arranged to drop back through the workpiece support table 20a within the chamber.

An alternative loading mechanism 25 is illustrated in FIG. 2 and in this case the table 16 is mounted for linear movement on a guide from a load chamber 26 into a processing chamber 27. The loading chamber is accessible through a lid 28 and the mechanism is driven by a motor 29.

I claim:

1. A workpiece loading mechanism, comprising a work station including a treatment bed having substantially continuous workpiece receiving surface and having a plurality of lifting elements, which pass through the bed and are arranged in lines, and means for moving the elements between a workpiece lift position and a withdrawn position in which they do not project above the surface; a pallet for supporting a plurality of workpieces in respective workpiece locations disposed in an array and means for moving the pallet into and out of the work station so that in one position it overlies the bed, the pallet defining a plurality of slots open at one end corresponding to the lines of the elements such that when the pallet is in said one position each element can pass through a slot to lift the workpieces off the pallet, at least one of the slots extending through a plurality of workpiece positions and such that the pallet can be withdrawn from the work station with the elements in the workpiece lift position and the elements can then lower the workpieces on to the bed as they return to their withdrawn position.

2. A mechanism as claimed in claim 1, wherein the lines are substantially straight and substantially parallel.

3. A mechanism as claimed in claim 1, wherein the elements are in the form of pins.

4. A mechanism as claimed in claim 1, wherein the elements are mounted on a common base for simultaneous movement.

* * * * *